(12) United States Patent
Perlov et al.

(10) Patent No.: US 6,287,386 B1
(45) Date of Patent: *Sep. 11, 2001

(54) CAROUSEL WAFER TRANSFER SYSTEM

(75) Inventors: Ilya Perlov, Santa Clara; Alexey Goder, Sunnyvale; Eugene Gantvarg, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/332,207

(22) Filed: Jun. 12, 1999

Related U.S. Application Data

(63) Continuation of application No. 08/869,111, filed on Jun. 4, 1997, now Pat. No. 5,951,770.

(51) Int. Cl.$^7$ .................................................. C23C 16/00
(52) U.S. Cl. ................... 118/719; 118/724; 204/298.25; 204/298.35; 414/217; 414/222; 414/223; 414/225; 414/331; 414/332; 414/403; 414/564; 414/749; 414/805; 414/806; 414/935; 414/937; 414/939; 414/941
(58) Field of Search .................................. 118/719, 724; 204/298.25, 298.35; 414/217, 222, 223, 225, 331, 332, 403, 564, 749, 800, 805, 806, 935, 937, 938, 939, 941

(56) References Cited

U.S. PATENT DOCUMENTS

| | | | |
|---|---|---|---|
| 4,664,578 | 5/1987 | Kakehi ................................. | 414/217 |
| 4,776,744 | 10/1988 | Stonestreet et al. .................. | 414/217 |
| 4,944,650 | * 7/1990 | Matsumoto .......................... | 414/757 |
| 4,951,601 | * 8/1990 | Maydan et al. ...................... | 118/719 |
| 4,971,512 | * 11/1990 | Lee et al. ........................... | 414/744.8 |
| 5,091,217 | * 2/1992 | Hey et al. .......................... | 427/248.1 |
| 5,133,635 | * 7/1992 | Malin et al. ....................... | 414/744.8 |
| 5,302,209 | * 4/1994 | Maeda et al. ......................... | 118/719 |
| 5,818,137 | 10/1998 | Nichols et al. . | |
| 5,863,348 | 1/1999 | Smith, Jr. et al. ..................... | 134/18 |
| 5,951,770 | * 9/1999 | Perlov et al. ......................... | 118/719 |

* cited by examiner

*Primary Examiner*—Jeffrie R. Lund
(74) *Attorney, Agent, or Firm*—Dugan & Dugan LLP

(57) ABSTRACT

The present invention generally provides a rotary wafer carousel and related wafer handler for moving wafers or other workpieces through a processing system, i.e., a semiconductor fabrication tool. Generally, the present invention includes a rotary wafer carousel having a plurality of wafer seats disposed thereon to support one or more wafers. The rotary carousel is preferably disposed through the lid in a transfer chamber opposite the robot which is preferably disposed through the bottom of the transfer chamber. The rotary carousel and the robot cooperate to locate wafers adjacent to process chambers and move wafers into and out of various chambers of the system. The invention improves the throughput of the system by positioning wafers adjacent to the appropriate chamber to reduce the amount of movement required of the robot for transporting wafers between chambers.

19 Claims, 11 Drawing Sheets

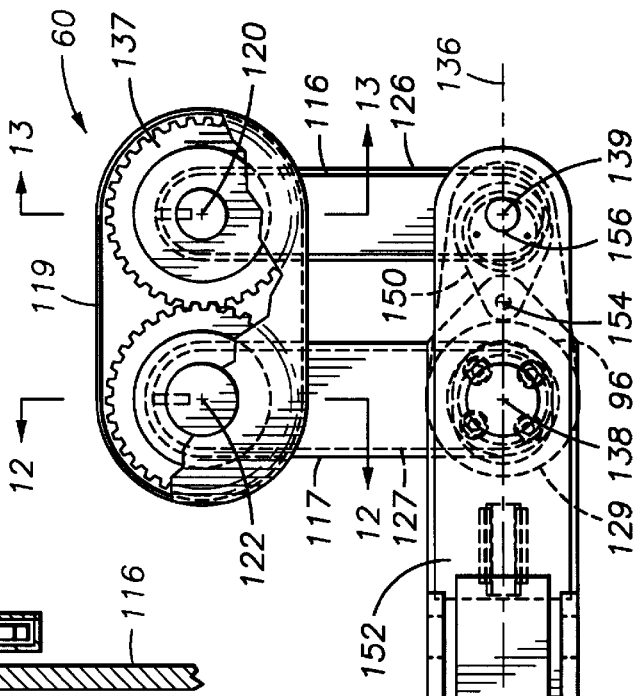
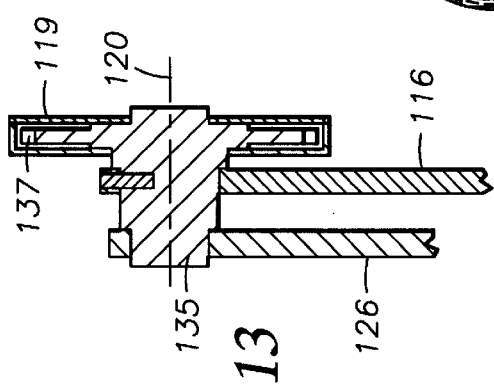
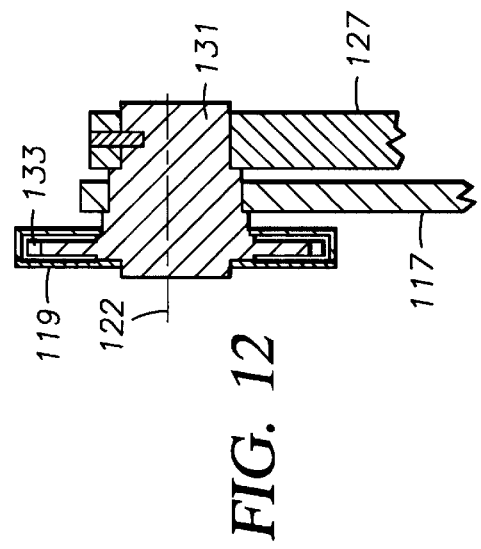
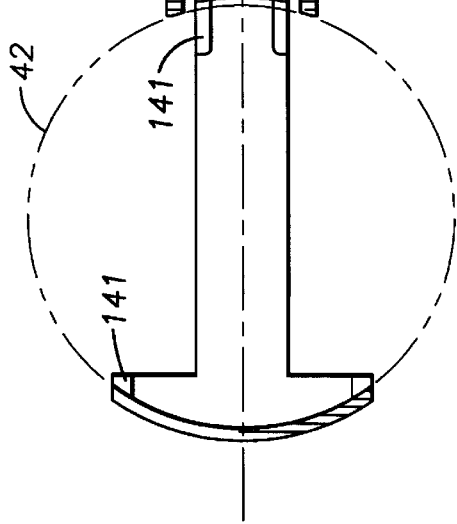
FIG. 7
FIG. 12
FIG. 13

CAROUSEL WAFER TRANSFER SYSTEM

This application is a continuation of U.S. patent application Ser. No. 08/869,111, filed Jun. 4, 1997 now U.S. Pat. No. 5,951,770.

FIELD OF THE INVENTION

The present invention relates to integrated circuit processing equipment, and more particularly, to a wafer handling module for transferring wafers through a processing system with high throughput.

BACKGROUND OF THE RELATED ART

Cluster tools are commonly used in the fabrication of integrated circuits. Cluster tools typically include a loadlock chamber for introducing wafers into the system, a central transfer chamber for moving wafers between the loadlock chamber, one or more process chambers and one or more cooldown chambers mounted on the transfer chamber. Typically, either a single blade or a double blade robot is located in the transfer chamber to move wafers between the loadlock chamber, the processing chamber(s), the cooldown chamber(s) and then back into the loadlock chamber. Exemplary cluster tools, robots and wafer handling methods are described in U.S. Pat. Nos. 4,951,601 and 5,292,393, both of which are incorporated herein by reference.

The use of robot arms is a well established manufacturing expedient in applications where human handling is inefficient and/or undesired. For example, robot arms are used in the semiconductor arts to handle wafers between various process steps. Such process steps include those which occur in a reaction chamber, e.g. etching, deposition, passivation, etc., where a sealed environment must be maintained to limit the likelihood of contamination and to ensure that various specific processing conditions are provided.

Current practice includes the use of robot arms to load semiconductor wafers from a loading port into various processing ports within a multiple chamber reaction system. The robot arm is then employed to retrieve the wafer from a particular port after processing within an associated process chamber. The wafer is then shuttled by the robot arm to a cooldown chamber and then a next port for additional processing or back into the loadlock chamber. When all processing within the reaction system is complete, the robot arm returns the semiconductor wafer to the loading port and a next wafer is placed into the system by the robot arm for processing. Typically, a stack of several semiconductor wafers is handled in this manner during each process run.

In multiple chamber reaction systems, it is desirable to have more than one semiconductor wafer in process at a time. In this way, the reaction system is used to obtain maximum throughput. In the art, a robot arm used in a reaction system must store one wafer, fetch and place another wafer, and then fetch and place the stored wafer. Although this improves use of the reaction system and provides improved throughput, the robot arm itself must go through significant repetitive motion. One exemplary One way to overcome the inefficiency attendant with such wasted motion is to provide a robot arm having the ability to handle two wafers at the same time. Thus, some equipment manufacturers have provided a robot arm in which the two carrier blades are rotated about a pivot point at the robot wrist by a motor with a belt drive at the end of the arm. In this way, one wafer may be stored on one carrier while the other carrier is used to fetch and place a second wafer. The carriers are then rotated and the previously stored wafer may be placed as desired. Such a mechanism is rather complex and requires a massive arm assembly to support the weight of a carrier drive located at the end of an extendible robot arm. For example, three drives are usually required for a system incorporating such a robot arm: one drive to rotate the arm, one drive to extend the arm, and one drive to rotate the carriers. Thus, any improvement in throughput as is provided by such a multiple carrier robot arm comes at a price of increase cost of manufacture, increased weight and power consumption, and increased complexity and, thus, reduced reliability and serviceability.

Another approach to providing a multiple carrier robot arm is to place two robot arms coaxially about a common pivot point. Each such robot arm operates independently of the other and improved throughput can be obtained through the increased handling capacity of the system, i.e. two arms are better than one. However, it is not simple to provide two robot arms for independent operation about a common axis. Thus, multiple drives and rigid shafts must be provided, again increasing the cost of manufacture and complexity while reducing reliability.

The various processes which are performed on the various wafers, may involve different time periods with which to perform the process. Therefore, some wafers may remain in a chamber for a short period of time after processing is completed before they are moved into a subsequent process chamber because a wafer is still being processed in the process chamber to which it is to be moved. This causes a backup of wafers which can cause a decrease in throughput of wafers in the system.

In addition to varying process times, another factor which must be considered is the time needed to cool down individual wafers following processing. Typically, along with process chambers, one or more cool down chambers are positioned adjacent to or mounted on the transfer chamber. Wafers are periodically moved into a cool down chamber to enable wafer cooling following processing. In addition, most wafers visit the cool down chamber before they are moved back into the loadlock chamber and removed from the system. As a result, the wafer robot must move wafers into and out of a cool down chamber which adds to the number of movements a robot must make in order to process a number of wafers. Additionally, incorporation of one or more cooldown chambers occupies positions on the transfer chamber where a process chamber could be positioned. Fewer process chambers can result in lower throughput of the system and increases the cost of each wafer processed.

Therefore, there remains a need for a wafer handling module which can increase throughput of wafers while also providing a station in which wafers can be cooled. It would be desirable if the wafer handling module could be used in presently available transfer chambers and systems so that the systems need not be redesigned.

SUMMARY OF THE INVENTION

The present invention provides an apparatus for use in semiconductor processing equipment, comprising a movable substrate carriage having one or more substrate storage positions, a substrate handler disposed adjacent the movable substrate carriage and having one or more blades to hold a substrate, a first actuator coupled to the movable substrate carriage, and one or more actuators coupled to the substrate handler. The first actuator may impart rotation and/or vertical motion to the movable substrate carriage. Preferably, the first actuator imparts both rotation and vertical motion to the movable substrate carriage and can raise the movable substrate carriage above a first plane in which the substrate handler operates and lower the movable substrate carriage below the first plane. Each substrate storage position preferably comprises a pair of opposing wafer seats having a passage therebetween. The passage should be wider than the substrate handler blade to allow movement therebetween.

The movable substrate carriage is preferably a rotary carousel disposed through the lid in a transfer chamber and the substrate handler is preferably a robot assembly which is disposed through the bottom of the transfer chamber. The rotary carousel and the robot cooperate to locate wafers adjacent to process chambers and move wafers into and out of various chambers of the system. The invention improves the throughput of the processing system by positioning wafers adjacent to the appropriate chamber to reduce the amount of movement required of the robot for transporting wafers between chambers and by providing a cooling station where wafers can be stored without requiring significant robot motion.

BRIEF DESCRIPTION OF THE DRAWINGS

The above and other advantages of the present invention are described in conjunction with the following drawing figures, in which:

FIGS. 6, 7 and 8 are top views of a wafer gripper mechanism with the robot blade in extended, partially retracted and fully retracted positions, respectively;

FIGS. 12 and 13 are cross-sectional views of linkages in the robot arm of FIG. 7.

DETAILED DESCRIPTION OF THE PREFERRED EMBODIMENT

The present invention generally provides a rotary wafer carousel and related wafer handler for moving wafers or other workpieces through a processing system, i.e., a semiconductor fabrication tool. Generally, the present invention includes a rotary wafer carousel having a plurality of wafer seats disposed thereon to support one or more wafers. The rotary carousel is preferably disposed through the lid in a transfer chamber opposite the robot which is preferably disposed through the bottom of the transfer chamber. The rotary carousel and the robot cooperate to locate wafers adjacent to process chambers and move wafers into and out of various chambers of the system. The invention improves the throughput of the system by positioning wafers adjacent to the appropriate chamber to reduce the amount of movement required of the robot for transporting wafers between chambers.

Figure 1:
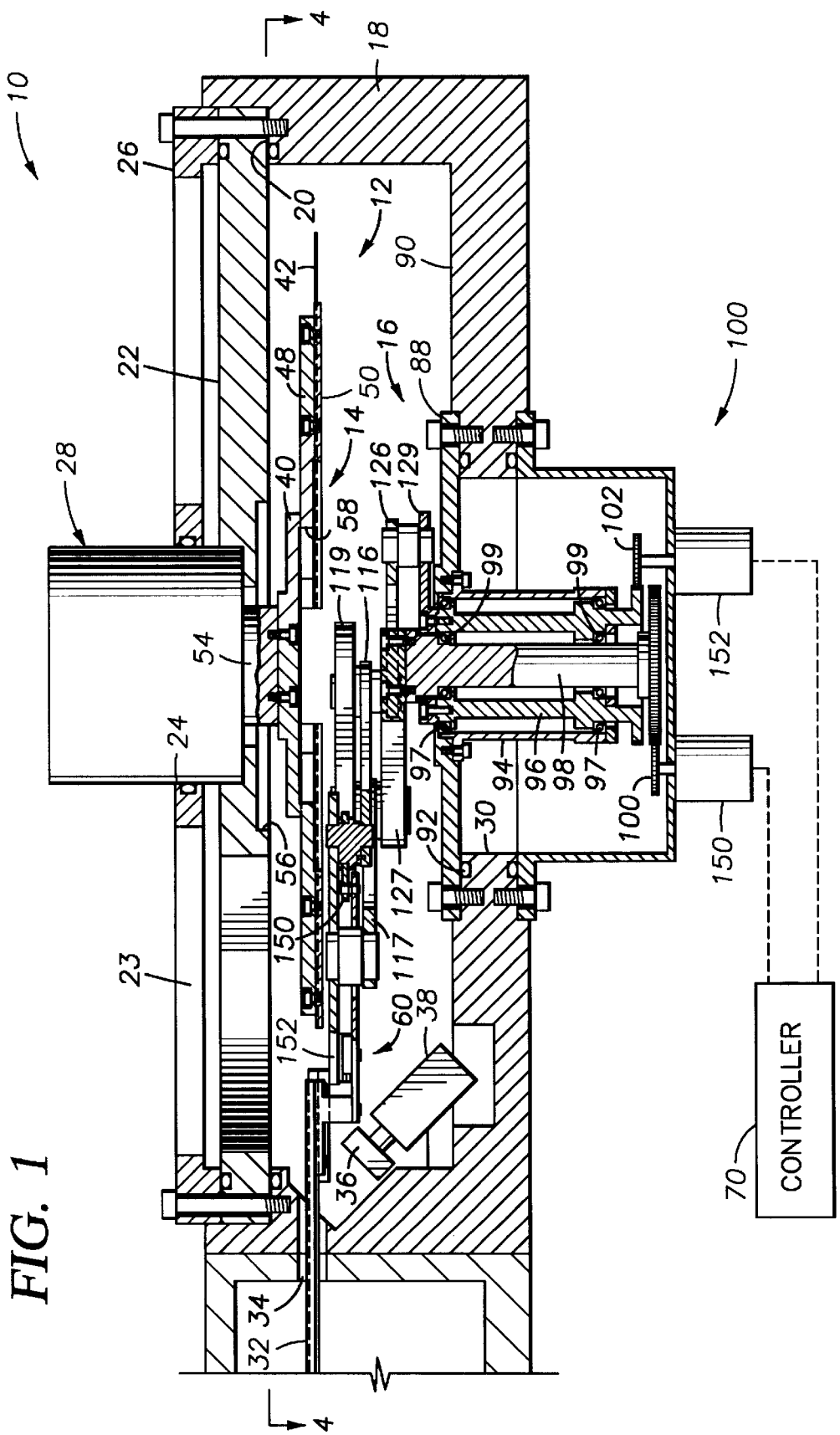
FIG. 1 is a cross-sectional view of a transfer chamber having one embodiment of the present invention disposed therein.

FIG. 1 is a cross sectional view of a transfer chamber 10 having a wafer handling module 12 of the present invention positioned therein. The wafer handling module 12 generally comprises a rotary wafer carousel 14 disposed in the upper portion of the transfer chamber 10 and a robot assembly 16 disposed in the lower portion of the transfer chamber 10. The rotary carousel 12 is supported on the upper surface 20 of the transfer chamber walls 18 by a support frame 22 and extends through a passage 24 formed in the transfer chamber lid 26 and is sealed therein. A carousel motor 28 is mounted to the support frame 22 and extends upwardly above the lid 26.

The robot assembly 16 is disposed through a passage 30 formed in the bottom of the transfer chamber 10 and is sealed therein. The robot 16 provides controlled movement of a wafer handling blade 32, shown here extended through a slit valve opening 34 while the slit valve door 36 is retracted by a slit valve actuator 38.

The Rotary Carousel

Figure 2:
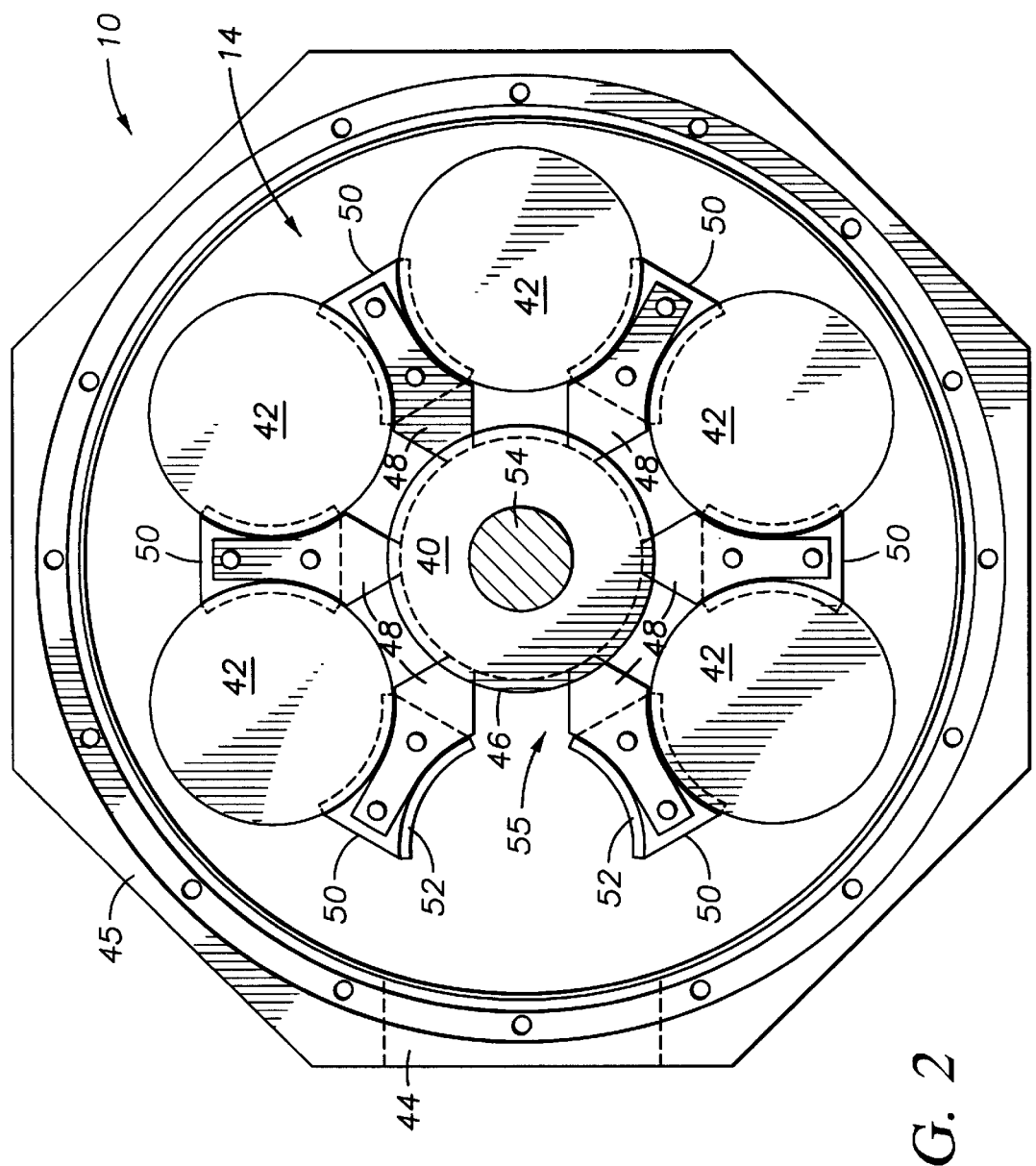
FIG. 2 is a top plan view of one embodiment of a rotary carousel disposed in a transfer chamber.

FIG. 2 is a top plan view of one embodiment of a rotary carousel 14 disposed in a transfer chamber 10. The rotary carousel 14 generally comprises a movable wafer storage member 40 which rotates in the transfer chamber 10 to move wafers 42 from an initial entry port in one side of the transfer chamber, such as side 44, past one or more processing stations in communication with other sides of the transfer chamber, such as side 45, and to another port such as the entry port or a port to another processing chamber. The carousel 14 serves as a wafer handler and, optionally, as a thermal station where wafers 42 are either heated or cooled depending on a particular process.

In one embodiment, the carousel 14 includes a central hub 46 and a plurality of blades 48 connected to and extending radially from the central hub 46. The central hub 46 and the blades 48 are preferably machined from the same piece of material or may be made of two or more separate parts connected together using bolts, screws or other connectors including welding. Any number of blades may be used within spacial limitations determined by the size of the transfer chamber 10 and the size of the wafer 42. In one embodiment, six blades 48 extend from the central hub 46. A separate wafer support member 50 may be mounted on each blade 48. It is preferred that two support members 50 be disposed on adjacent blades 48 to define annular wafer seats 52 on which a wafer 42 is supported by a portion of its perimeter edge. The wafer support members 50 are preferably made of a ceramic such as $Al_2O_3$, quartz or any other hard material which is compatible with wafers and does not produce particles or scratch a wafer on contact with the wafer. Each wafer support member 50 preferably has two sides which each define an annular wafer seat 52 which cooperates with an adjacent wafer seat 52 on an adjacent support member 50 to secure a wafer 42 therebetween. By placing the wafer 42 on seats 52 secured to adjacent blades 48, a passage 55 is maintained for a robot blade to access a wafer 42 and transfer it to a processing station.

Referring back to FIG. 1, the central hub 40 is mounted to or otherwise connected to a shaft 54 of an actuator 28, such as a servo motor, to provide movement to the central hub, i.e., rotation of the central hub and movement in the z direction (in and out of the page as shown in FIG. 2). The shaft of the actuator rotates the central hub 40 to position wafers adjacent to the process chamber in which the wafer is to be moved and also moves the central hub up and down relative to the robot assembly 16 to position a wafer 42 onto the carousel 14 or lift a wafer 42 off of the carousel 14.

Preferably, a servo motor is employed to achieve the desired motion of the carousel. The actuator is supported above the transfer chamber on a support frame 22. The central region of the support frame defines a recess 56 into which the central hub 40 of the rotary carousel 14 is recessed when it is positioned in a first position for rotation within the transfer chamber.

The central hub 40 preferably defines a central recess 58 on its lower surface in which a portion of the robot assembly 16 may be received when the carousel 14 is moved towards the robot assembly into a second position where the carousel 14 is lowered in the transfer chamber 10 to position a wafer on the robot arm 60 or retrieve a wafer from the robot arm 60. The blades 48 and the wafer support members 50 define the passage 55 (See FIG. 2) which allows the robot arm 60 to move therebetween when the carousel 14 is in its lower position.

Figure 3:
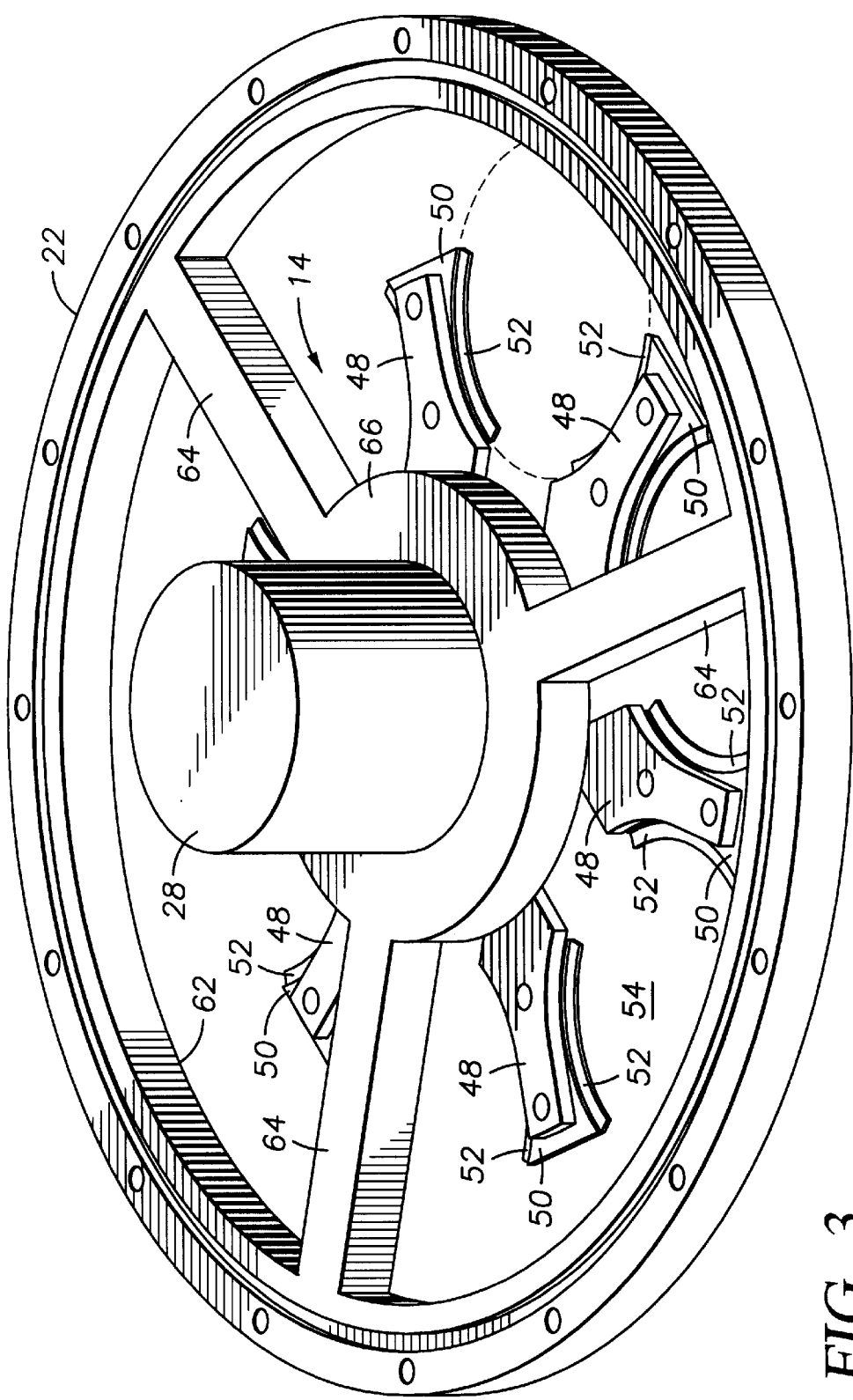
FIG. 3 is a top perspective view of one embodiment of a rotary carousel of the present invention.

FIG. 3 is a top perspective view of the rotary carousel 14 of one embodiment of the present invention showing the motor support bracket 22 on which the actuator 28 and the carousel 14 are mounted. The motor support bracket 22 may be configured in any manner suitable to support the actuator and carousel. In one embodiment of the invention, the bracket 22 comprises an outer annular support ring 62 which rests on and mates with an upper surface of the transfer chamber wall, a plurality of radial struts 64 (preferably three), and an inner annular hub 66 for coupling with the actuator 28. While the support frame 22 may include any number and configuration of beams, it is preferred that the support frame be substantially open to minimize the weight of the member and to allow the wafers held on the carousel to be in better thermal communication with a cooling member, such as a water cooled lid. The motor support bracket 26 is sealed along its outer perimeter with the chamber wall 12 using o-rings. The motor support bracket is preferably made of a material such as aluminum to provide the support necessary for the motor 24.

Figure 4:
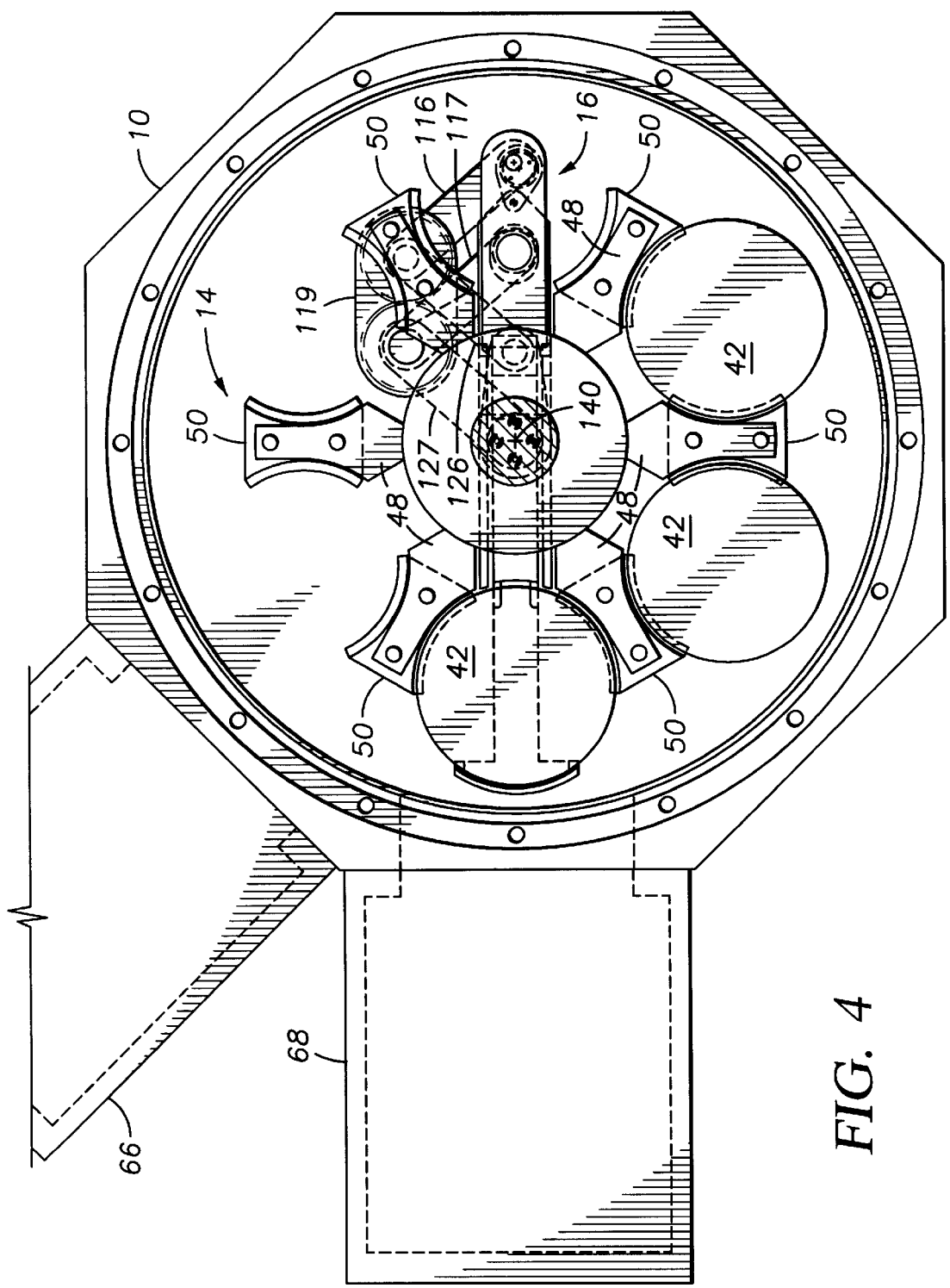
FIG. 4 is a top view of a transfer chamber showing the rotary carousel in the robot disposed in the transfer chamber with the robot in the retracted position.
Figure 5:
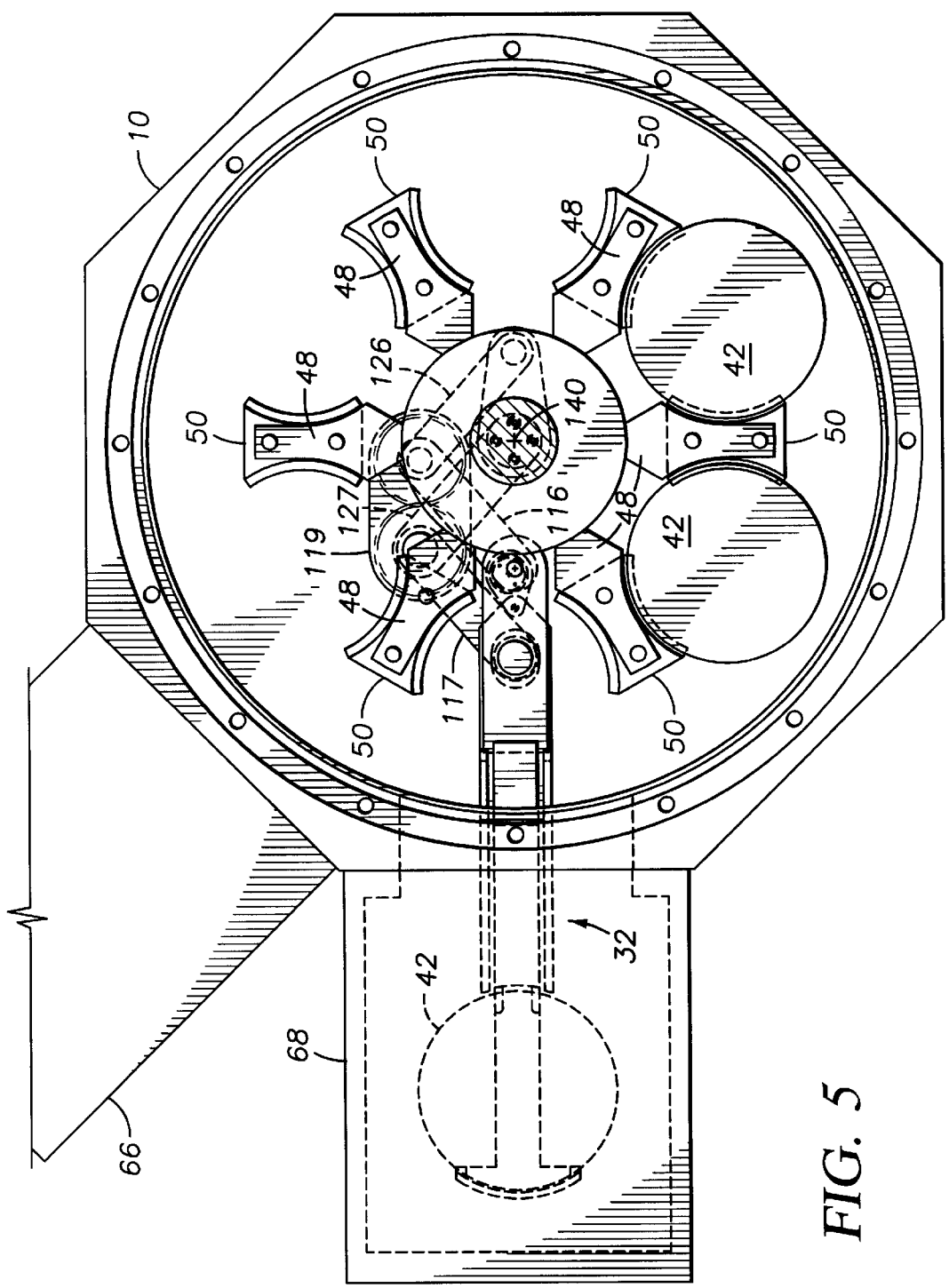
FIG. 5 is a top view of the transfer chamber showing the rotary carousel and the robot assembly disposed in the transfer chamber having the robot assembly in an extended position.

FIGS. 4 and 5 are cross-sectional top views of the transfer chamber 10 of FIG. 1 taken along line 4—4 showing the rotary carousel 14 and the robot 16 disposed in the transfer chamber with the robot arm in a retracted and extended position, respectively. In operation, the rotary carousel 14 is loaded with one or more wafers 42 introduced into the transfer chamber 10 from a loadlock chamber 66. As wafers are loaded onto the carousel, other wafers are off loaded into processing chambers, such as chamber 68, by the robot assembly 16 positioned in the transfer chamber. Once a wafer is processed, the robot assembly retrieves the wafer and positions the wafer back on the carousel. As the carousel 14 rotates, the processed wafers 42 positioned thereon may be cooled as a result of time spent on the carousel and by thermal communication with cooling pockets 23 formed in the transfer chamber lid 26 (see FIG. 1). The cooling pockets 23 are preferably formed by leaving a narrow space between adjacent, parallel plates formed in or adjacent to the chamber lid 26 and are preferably in communication with a cooling water source. In addition to cooling the wafers, heating pockets may also be formed in the transfer chamber lid to heat the wafer before the wafer is moved into a process chamber. This heating function can serve multiple functions such as outgassing of impurities or water from the wafer, heating the wafer to a desired processing temperature, or the like. While the source of heat may be a hot water source, it is preferred that the heating pockets be provided with a resistance heating element. Once a wafer has been processed and cooled down on the carousel, the robot assembly positions the wafer in the loadlock chamber or other port for removal from the system.

Robot Assembly

The robot 16 is disposed at the lower portion of the transfer chamber 10 and preferably includes magnetic coupling to actuate the robot arm. In one embodiment of the invention, the robot assembly 16 provides a single blade robot which moves a single wafer 42 from wafer seats 52 on the carousel 14 into a chamber or from a support member within a chamber back onto the carousel in the transfer chamber.

Referring again to FIG. 1, the robot assembly 60 includes a removable base plate 88 that is mounted to the bottom wall 90 of the transfer chamber 10 with an O-ring 92 disposed therebetween. Fixed hollow outer shaft 94 is mounted to the base plate 88. Hollow middle shaft 96 is mounted for rotation within the outer shaft 94 by journal bearings 97. An inner shaft 98 is mounted by journal bearings 99 within the middle shaft 96. The concentric middle shaft 96 and inner shaft 98 are independently rotated, typically by stepper motor-controlled cable and drum drive mechanisms 100 and 102, respectively. The operation of respective stepper motors 150 and 152 is controlled by the controller/computer 70. As discussed below, rotation of the inner shaft 98 and of the outer shaft 96 are converted into precise R and q movements, respectively, of the robot blade assembly 60 by a dual four-bar link mechanism.

Figure 6:
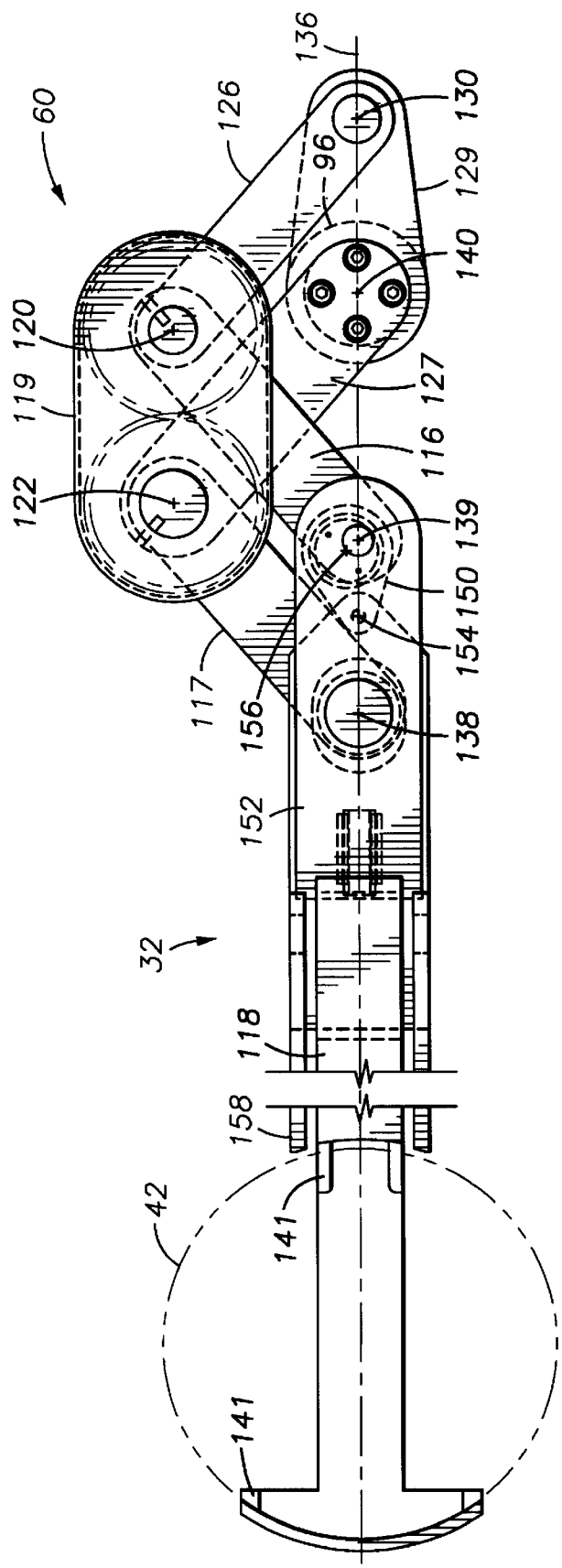
Figure 8:
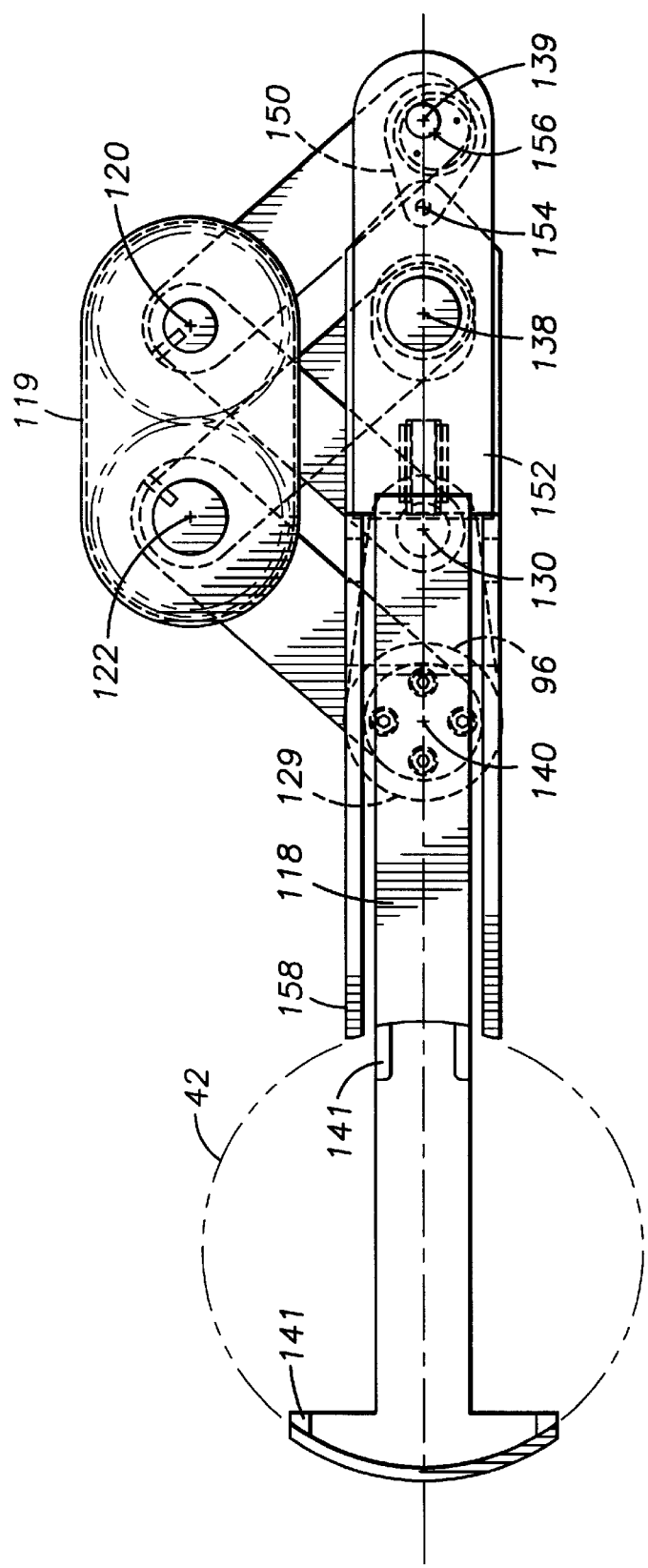

FIGS. 6, 7 and 8 are top views of a robot arm and blade assembly 60 suitable for use with the carousel 40 of FIG. 2 having two four-bar link mechanisms. The assembly 60 comprises a first, four-bar link mechanism having first and second parallel arms 116 and 117, respectively, attached to the link 119 and the blade link 118. Arm 126 is mounted between the link 119 and the bracket 129 via pivot pin 130. The bracket 129 itself is fixedly mounted to the upper end of the middle shaft 96. Arm 127 is fixedly mounted to the upper end of inner shaft 98, which extends through the inner shaft 98, and pivotally coupled to the link 119 at point 122.

Because of this cooperative mounting using common link 119, the reversible rotation of the inner shaft 98 about point 140 relative to point 130 rotates the drive arm 127 and, through a series of gears or belts, both arms 116, 117 to thereby transform the shaft rotation into bidirectional translation of the blade 32 and the arm assembly 60. As a consequence of the fixed relative positions of the pivot points 120 and 122 on link 119, of pivot points 130 and 140 on link 129, and of pivot points 138 and 139 on blade 32, the two, four-bar link mechanisms maintain their parallelogram configuration during rotation. The movement of the blade 32 and arm assembly 60 is thus parallel to (along) axis 136 through the pivot points associated with blade 32 and link 129.

The robot blade 32 comprises a recessed wafer seat 141 formed in the distal end of the blade 32 to secure and transport wafers 42. In one preferred embodiment, the blade 32 also includes an automatic wafer gripper mechanism that presses against the perimeter edge of the wafer to further secure the wafer during transport. One preferred automatic wafer gripper is shown in FIGS. 6, 7 and 8 in cooperation with the robot arm assembly 60.

Referring specifically to FIG. 6, the parallel arms 116 and 117 are pivotally coupled to the blade link 118 along the centerline 136 of the blade link 118. An over center mechanism is employed in connection with one of the two arms, shown in FIGS. 6, 7 and 8 in connection with arm 116. The over-center mechanism comprises a linking member 150 having a first end pivotally coupled to the wafer gripper plate 152 at pivot point 154 and a second end pivotally coupled to an offset portion, or lever arm, of the arm 116 at point 156.

The point 156 is fixed in relation to the arm 116 and will rotate about point 139 along with rotation of the arm 116. The arm 116 is at such an angle with respect to the blade link 118 that the point 156 is above the centerline 136 and the point 154 is pulled toward point 139. As a result, the end of the wafer gripper plate 152 having at least one clamp finger 158 is pulled away from the perimeter edge of the wafer 42, releasing the wafer. This extended position of the blade is representative of how the robot transfers wafers into and out of a chamber that is in communication with the transfer chamber 10.

FIG. 7 is a schematic view of the wafer gripper mechanism of FIG. 6 with the robot blade partially retracted. The angle between the arm 116 and the blade link 118 is increased to nearly perpendicular. At this or some other angle, the point 156 of the linking member 150 passes over the centerline 136 extending the distance between point 139 and point 154 and, ultimately, pushing the clamp finger 158 against the perimeter edge of the wafer. The travel of the clamp finger 158 is limited by the linking member 150. It is also anticipated that the wafer gripper plate 152 may comprise a spring-loaded member (not shown) to limit the amount of force imparted on the wafer 42.

FIG. 8 is a schematic view of the wafer gripper mechanism of FIGS. 6 and 7 with the robot blade fully retracted to a position where the wafer seat 141 on the blade would be vertically aligned with the carousel wafer seat 52 to exchange a wafer therebetween. With the point 156 rotated past the centerline 136, the point 154 is again drawn toward the point 139 and the clamp finger 158 is pulled away from the wafer 42 to release the wafer. The release of the wafer occurs automatically when the robot arms are retracted to an appropriate angle corresponding to alignment of the blade and carousel wafer seats 141, 52, respectively. When the robot arm is extended, it should be recognized that a reverse sequence of FIGS. 8, 9 and 10 will occur. In this manner, the wafer is released at appropriate degrees of extension and retraction where wafer exchange is to occur. Conversely, the wafer is clamped under all other conditions.

FIGS. 4 and 5 illustrate movement of the four-bar links 115 and 125 during rotation of the shaft 98 and drive arm 127. Initially, as shown in FIG. 4, the robot arm is retracted to position the blade 32 to exchange a wafer with the carousel 14. Referring to FIG. 5, rotation of the inner shaft 98 and drive arm 127 (counter-clockwise in the present configuration as shown from the top) moves the blade outwardly into the load lock chamber 68, thereby extending the blade 32 to exchange a wafer within the chamber, typically having its own lift pin assembly, wafer cassette indexing system, or other elevator device for use in cooperation with the blade. It should be recognized that the robot arm assembly could be designed with the links positioned in a mirror image to that shown and, thereby, cause extension of the blade by clockwise rotation of the inner shaft 98.

The arms 116, 117 are disposed in a horizontal plane that is above the horizontal plane of the link 119 and the arms 126, 127 are disposed in a horizontal plane below the plane of link 119. In this manner, the robot arm assembly 60 can be retracted over itself past the pivot point 140. In the retracted position, the assembly 60 occupies a minimum area and, thus, traverses a relatively small area of the load lock chamber during rotation. The extension and retraction of the assembly 60 in the radial direction is effected by rotating the inner shaft 98 and rotation of the assembly about point 140 is effected by rotating the middle shaft 96 and flange 134.

The R-q movement of the robot allows for insertion of the blade 32 through a slit valve 34 into a selected process chamber over the wafer support, susceptor or electrode within the chamber. Within the chamber, preferably a set of bidirectionally actuated lift pins may be used to lift the wafer from the blade 118, transfer the wafer to the associated chamber electrode or susceptor for processing, then return the wafer onto the reinserted blade 118 after processing.

In operation, wafers are unloaded from the loadlock chamber and positioned on the rotary carousel. The rotary carousel may then be rotated so that each of the slots on the rotary carousel can be loaded with a wafer. Wafers are held on the carousel when not being transferred between or positioned within a processing or loadlock chamber. The carousel is rotated to provide one or more wafers in a location within the transfer chamber that is convenient to accomplish one or more sequences of processes on one or more wafers in an efficient manner, preferably to maximize throughput. It should be noted that the carousel and robot are independently actuated and controlled, preferably through a common microprocessor, which allows the carousel and robot to work in cooperation.

Figure 9:
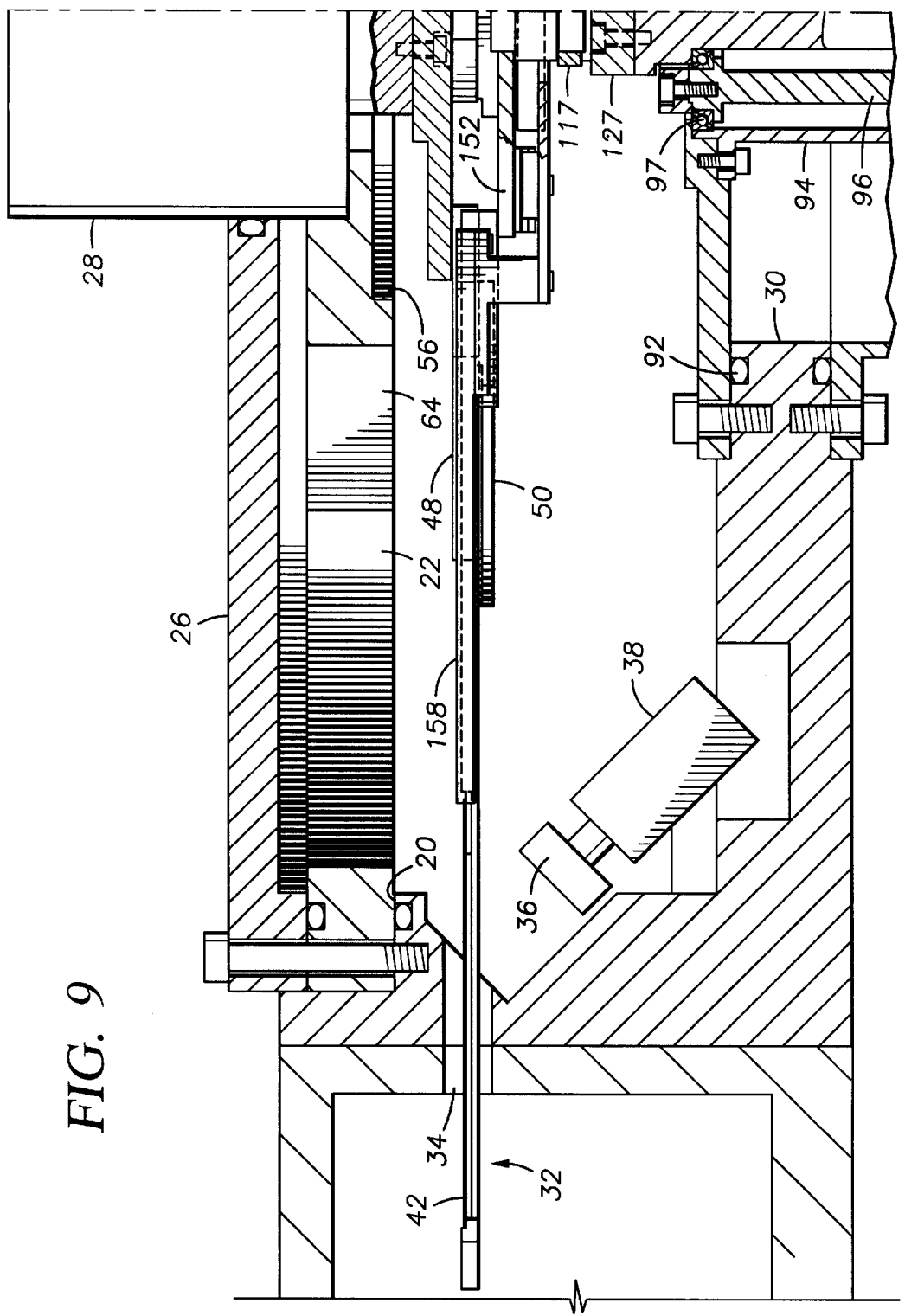
FIGS. 9, 10 and 11 are cross-sectional views of the robot arm and wafer carousel during transfer of a wafer therebetween.
Figure 10:
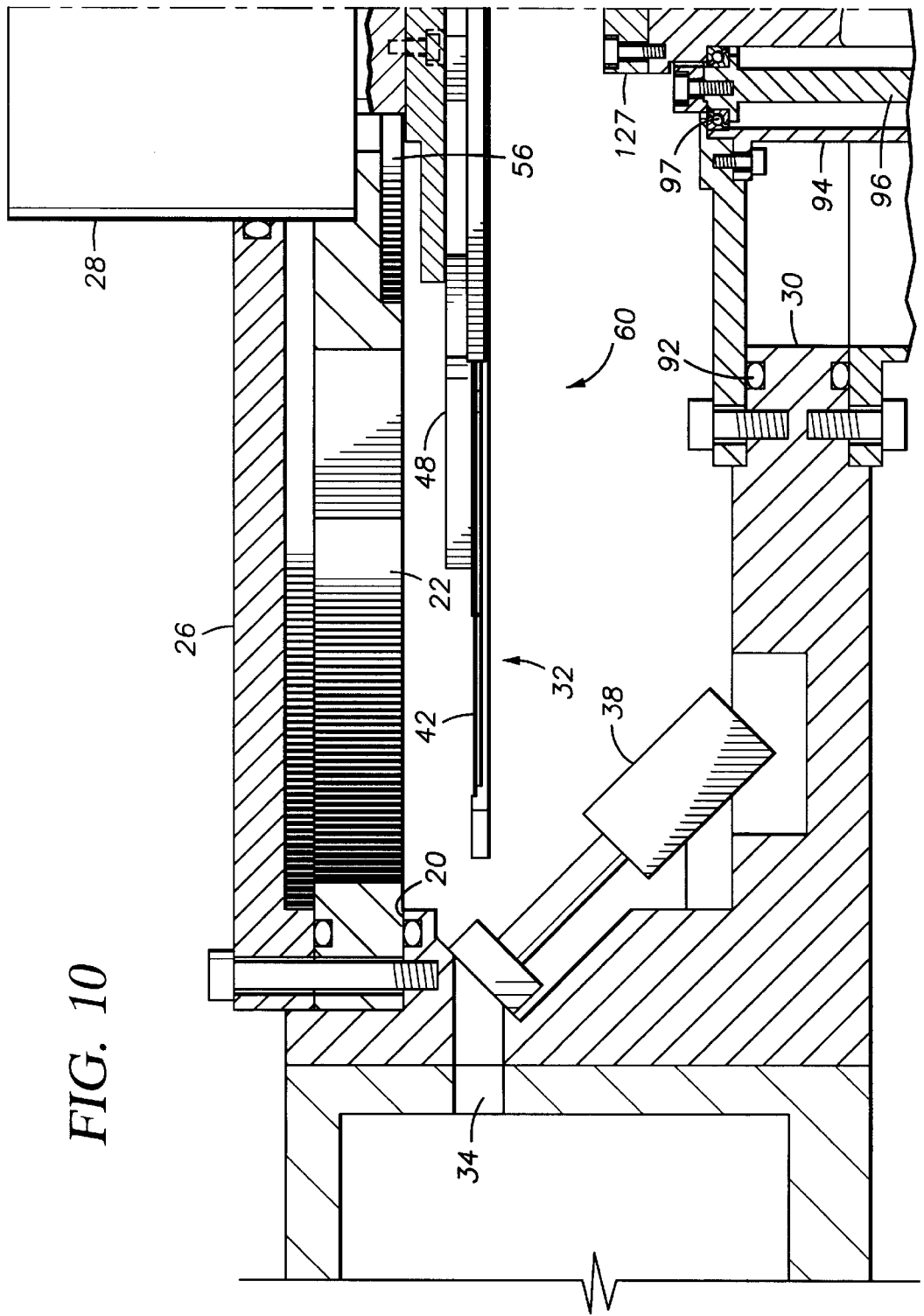
Figure 11:
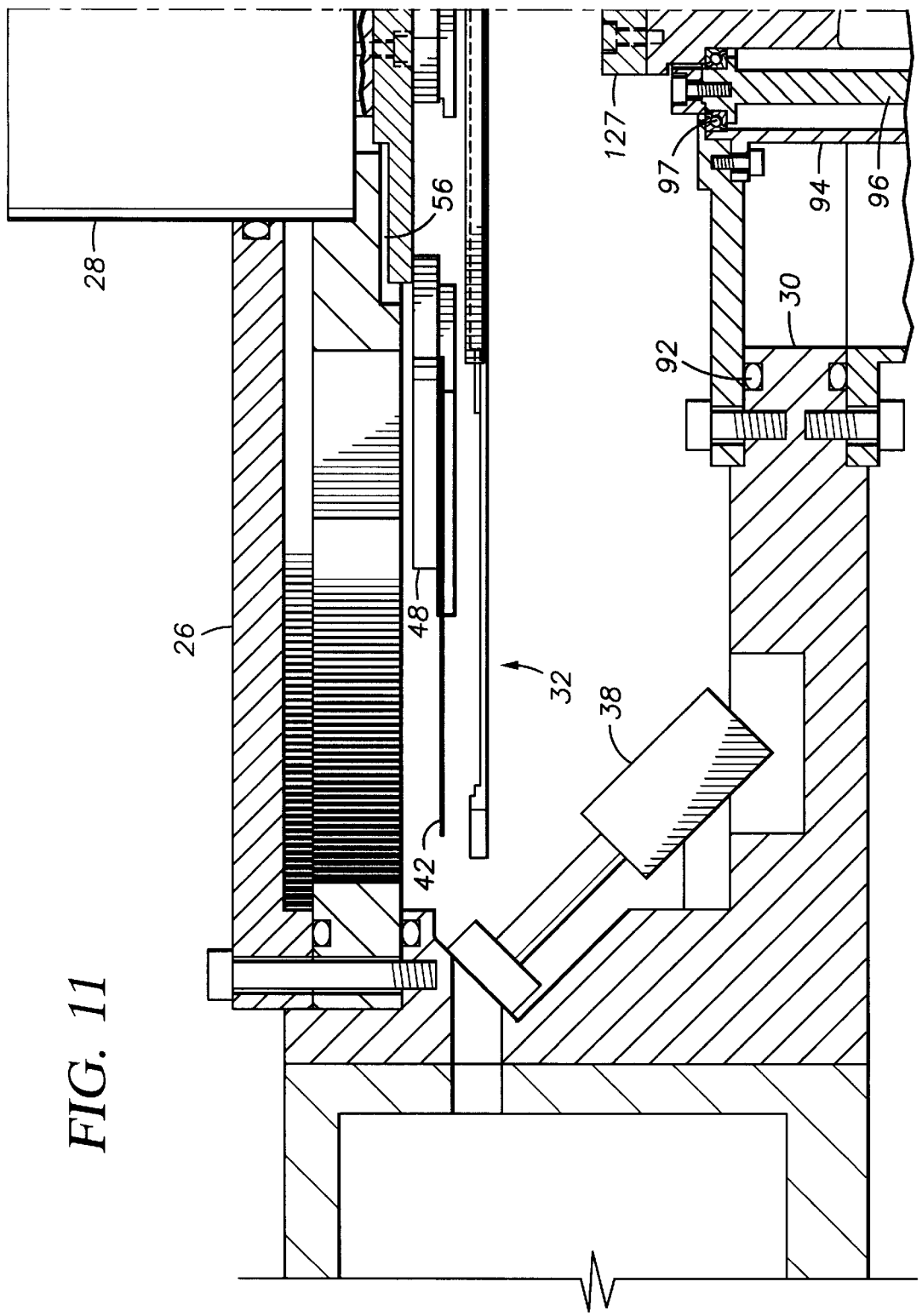

FIGS. 9, 10 and 11 are cross-sectional views of the robot arm and wafer carousel during transfer of a wafer therebetween. Referring to FIG. 9, to transfer a wafer from the robot blade 32 to the carousel, the wafer support member 50 is lowered, so that the carousel wafer seat 52 lies below the plane of the wafer 42 as it sits on the robot blade 32, before the robot blade is retracted to a position where the wafer is located above the wafer seat 52 of the rotary carousel. Referring to FIG. 10, after retraction of the robot blade 32, the rotary carousel is then moved upwardly in the chamber, thereby lifting the wafer 42 from the blade 32 and onto the wafer seat 52. Referring to FIG. 11, the carousel continues to move upwardly out of the plane of the robot arm, thereby allowing the robot arm to rotate and move freely about the chamber 10 without interference of the carousel.

Conversely, to transfer a wafer to the robot blade from the carousel, the robot blade is moved in position under the wafer (or alternatively, the carousel is moved in position above the wafer) and the carousel is lowered within the chamber until the wafer comes to rest on the wafer seat of the blade. The robot blade then supports the wafer as the carousel continues to move downwardly in the chamber a sufficient distance so that the wafer is cleared of the carousel wafer seat and is able to be moved by the robot blade in a radial direction away from the carousel. It is preferred that this exchange from carousel to blade occur directly in front of a chamber for insertion of the wafer.

FIGS. 12 and 13 are cross-sectional views of linkages in the robot arm of FIG. 7. In FIG. 12, it is shown that a member 131 is fixedly attached to the link arm 127 and pivotally couples link 117 about axis 122, and is fixedly attached to the gear 133. FIG. 13 shows that the link arm 116 and gear 137 are fixedly attached to the member 135 and that the link arm 126 is pivotally coupled to member 135 about axis 120. In this manner, the links 126, 127 are always rotated in equal and opposite directions to maintain linear extension and retraction of the robot blade 118.

While the foregoing is directed to the preferred embodiment of the present invention, other and further embodiments of the invention may be devised without departing from the basic scope thereof, and the scope thereof is determined by the claims which follow.

What is claimed:

1. An apparatus for supplying wafers to a wafer handler, comprising:

a rotatable substrate storage member having a pair of opposing substrate seats adapted to support a substrate; and a rotatable substrate handler having a substrate supporting blade, the rotatable substrate handler being operatively coupled to the rotatable substrate storage member, such that when the pair of opposing substrate seats are positioned in a vertical line with the substrate supporting blade, relative vertical motion between the substrate storage member and the substrate handler results in the transfer of a substrate between the substrate seats and the substrate supporting blade.

2. A transfer chamber comprising:

an enclosure having a plurality of slits therein and a ceiling;

a rotatable substrate handler having a substrate supporting blade adapted to selectively extend through the plurality of slits;

a rotatable substrate storage mechanism positioned above the rotatable substrate handler, the substrate storage mechanism having a seat adapted to support a substrate; and a temperature adjustment mechanism coupled to the ceiling of the enclosure adapted to alter the temperature of the ceiling and to thereby alter the temperature of a substrate supported by the storage mechanism, the storage mechanism being sufficiently close to the ceiling to be in thermal communication therewith.

3. The apparatus of claim 2 wherein the substrate handler and the substrate storage mechanism are operatively coupled such that when the seat of the substrate storage mechanism and the substrate supporting blade are positioned in a vertical line, relative vertical motion between the substrate storage mechanism and the substrate handler results in the transfer of a substrate between the storage mechanism and the substrate handler.

4. A method for handling wafers within a transfer chamber and through a plurality of slit valves, comprising:

(a) extending a wafer handling member through a slit valve to receive a wafer thereon;

(b) rotating a wafer carousel having a plurality of wafer seats, to align a wafer seat with the slit valve;

(c) lowering the wafer carousel to position the wafer seat below the slit valve;

(d) retracting the wafer handling member to position the wafer directly above the wafer seat; and (e) raising the wafer carousel to lift the wafer from the wafer handling member.

5. A method for handling wafers within a transfer chamber and through a plurality of slit valves, comprising:

(a) rotating a wafer carousel having a plurality of wafer seats to align a wafer seat with a slit valve, wherein a wafer is disposed on the wafer seat;

(b) rotating a wafer handling member into alignment with the slit valve;

(c) lowering the wafer carousel to position the wafer seat below the slit valve;

(d) receiving a wafer on the wafer handling member; and (e) extending the wafer handling member through the slit valve.

6. The method of claim 5 further comprising:

adjusting the temperature of the wafer disposed on the wafer seat.

7. The method of claim 6 wherein adjusting the temperature of the wafer comprises adjusting the temperature of a mechanism coupled to the ceiling of the transfer chamber, and thereby adjusting the temperature of the wafer.

8. The method of claim 6 wherein adjusting the temperature of the wafer comprises adjusting the temperature of the ceiling of the transfer chamber and thereby adjusting the temperature of the wafer.

9. A method for handling wafers within a transfer chamber and through a plurality of slit valves, comprising:

(a) rotating a wafer carousel having a plurality of wafer seats to align a wafer seat with a slit valve, wherein a wafer is disposed on the wafer seat;

(b) rotating a wafer handling member into alignment with the slit valve; and (c) changing the relative vertical position between the wafer carousel and the wafer handling member, so as to transfer a wafer therebetween.

10. The method of claim 9 further comprising:

adjusting the temperature of the wafer disposed on the wafer seat.

11. The method of claim 10 wherein adjusting the temperature of the wafer comprises adjusting the temperature of a mechanism coupled to the ceiling of the transfer chamber, and thereby adjusting the temperature of the wafer.

12. The method of claim 10 wherein adjusting the temperature of the wafer comprises adjusting the temperature of the ceiling of the transfer chamber and thereby adjusting the temperature of the wafer.

13. A method of transferring substrates between various processing chambers via a substrate handler contained in a transfer chamber, the method comprising:

storing a plurality of substrates in single substrate stacks, above the substrate handler; and extracting the substrates from storage via the wafer handler.

14. The method of claim 13 further comprising:

heating one or more of the plurality of substrates while in storage.

15. The method of claim 14 wherein heating one or more of the plurality of substrates comprises thermally coupling the one or more substrates to a heated portion of the transfer chamber ceiling.

16. The method of claim 13 further comprising:

cooling one or more of the plurality of substrates while in storage.

17. The method of claim 16 wherein cooling the one or more of the plurality of substrates comprises thermally coupling the one or more substrates to a cooled portion of the transfer chamber ceiling.

18. A transfer chamber comprising a substrate handler, a plurality of slit valves, and further comprising:

a rotatable storage mechanism for storing substrates to be transferred via the substrate handler through a plurality of the slit valves, the rotatable storage mechanism having a plurality of storage locations for storing individual substrates.

19. A substrate handling method, comprising:

positioning a substrate supported on a rotatable substrate storage mechanism in line with a transfer chamber slit valve and vertically offset from the transfer chamber slit valve;

positioning a rotatable substrate handler such that a substrate supporting portion of the substrate handler is in line with both the transfer chamber slit valve and the substrate supported by the rotatable substrate support, and is vertically offset from the substrate;

changing the relative vertical positions of the substrate and the rotatable substrate handler so as to transfer the substrate to the rotatable substrate handler; and extending the substrate handler so as to transport the substrate through the slit valve.

* * * * *